United States Patent [19]
Tani et al.

[11] Patent Number: 5,514,326
[45] Date of Patent: May 7, 1996

[54] COPPER PASTE FOR INTERNAL CONDUCTOR OF MULTILAYER CERAMIC ELECTRONIC COMPONENT

[75] Inventors: Hiroji Tani; Kazuhito Ohshita; Mitsuyoshi Nishide, all of Kyoto, Japan

[73] Assignee: Murata Manufacturing Co., Ltd., Japan

[21] Appl. No.: 339,495

[22] Filed: Nov. 14, 1994

Related U.S. Application Data

[62] Division of Ser. No. 21,265, Feb. 22, 1993, Pat. No. 5,405,707.

[30] Foreign Application Priority Data

Feb. 20, 1992 [JP] Japan ..................................... 4-72320

[51] Int. Cl.$^6$ ........................................................ B22F 7/02
[52] U.S. Cl. ............................ 419/9; 419/5; 419/8; 419/10; 419/19
[58] Field of Search ........................ 419/5, 8, 9, 10, 419/19

[56] References Cited

U.S. PATENT DOCUMENTS

| | | | |
|---|---|---|---|
| 4,517,155 | 5/1985 | Prakash et al. | 419/19 |
| 4,766,027 | 8/1988 | Burn | 428/210 |
| 4,863,683 | 9/1989 | Nakatani et al. | 419/10 |
| 4,877,554 | 10/1989 | Honma et al. | 252/511 |
| 4,879,261 | 11/1989 | Burn | 501/32 |
| 4,959,333 | 9/1990 | Mori et al. | 501/136 |
| 4,985,381 | 1/1991 | Mori et al. | 501/136 |
| 5,117,326 | 5/1992 | Sano et al. | 361/321 |

FOREIGN PATENT DOCUMENTS

| | | | |
|---|---|---|---|
| 1160604 | 9/1989 | Japan | B28B 1/30 |
| 2159093 | 9/1990 | Japan | H05K 3/12 |
| 2166793 | 9/1990 | Japan | H05K 3/46 |
| 3276796 | 3/1992 | Japan | H05K 3/46 |
| 4292456 | 3/1993 | Japan | C04B 35/46 |
| 51-90375 | 11/1993 | Japan | H01G 4/12 |

*Primary Examiner*—Donald P. Walsh
*Assistant Examiner*—John N. Greaves
*Attorney, Agent, or Firm*—Ostrolenk, Faber, Gerb & Soffen

[57] ABSTRACT

In order to form internal conductors of a multilayer ceramic electronic component such as a multilayer ceramic capacitor, copper paste containing copper powder having a mean particle size of 0.3 to 2 μm in a particle size range of 0.1 to 4 μm and ceramic powder having a main component which is common to that of a ceramic material contained in the multilayer ceramic electronic component and being in a particle size range of 0.5 to 8 μm, as well as an organic vehicle and a solvent with the contents of the copper powder and the ceramic powder and the total content of the organic vehicle and the solvent in ranges of 40 to 70 percent by weight, 1 to 15 percent by weight and 25 to 60 percent by weight respectively is applied onto ceramic green sheets. The ceramic green sheets provided with such copper paste films are stacked and fired so that occurrence of voids in the laminate and deformation of the laminate are suppressed in the as-obtained multilayer ceramic electronic component.

16 Claims, 2 Drawing Sheets

COPPER PASTE FOR INTERNAL CONDUCTOR OF MULTILAYER CERAMIC ELECTRONIC COMPONENT

This is a division of application Ser. No. 08/021,265, filed Feb. 22, 1993, now U.S. Pat. No. 5,405,707.

BACKGROUND OF THE INVENTION

1. Field of the Invention

The present invention relates to copper paste for an internal conductor of a multilayer ceramic electronic component such as a multilayer ceramic capacitor or a multilayer circuit board.

2. Description of the Background Art

FIG. 3 is a sectional view showing a conventional multilayer ceramic capacitor 1. This multilayer ceramic capacitor 1 comprises a laminate 5, which is obtained by alternately stacking a plurality of ceramic layers 2 and plural internal electrodes 3 and 4. This laminate 5 is provided with external electrodes 6 and 7 on its end surfaces respectively. The internal electrodes 3 extend toward the left end surface of the laminate 5 appearing in FIG. 3, to be electrically connected with the external electrode 6 on this end surface. On the other hand, the internal electrodes 4 extend toward the right end surface of the laminate 5 appearing in FIG. 3, to be electrically connected with the external electrode 7 on this end surface. These internal electrodes 3 and 4 are alternately arranged.

In relation to the aforementioned multilayer ceramic capacitor 1, an attempt has been made to employ copper as a metal for forming the internal electrodes 3 and 4 and the external electrodes 6 and 7 in order to reduce the cost. In this case, at least the internal electrodes 3 and 4 must be cofired with the ceramic material contained in the ceramic layers 2. Such a cofiring step must be carried out in a reducing or neutral atmosphere in order to prevent oxidation of the copper contained in the internal electrodes 3 and 4. Further, the ceramic layers 2 must contain a nonreducing ceramic material, so that the ceramic material is not reduced by the cofiring step carried out in such an atmosphere.

In order to manufacture the aforementioned multilayer ceramic capacitor 1 comprising the internal electrodes 3 and 4 containing copper, a plurality of ceramic green sheets are prepared and copper paste is printed on specific ones of such ceramic green sheets for forming the internal electrodes 3 or 4. Then the ceramic green sheets are stacked and pressed to each other, and then cut into proper dimensions to provide a green laminate for forming the laminate 5. Then, copper paste is applied to both end surfaces of this green laminate, to form the external electrodes 6 and 7 respectively. Then the ceramic material and the copper paste contained in the as-obtained structure are cofired in a reducing or neutral atmosphere such as a nitrogen atmosphere, for example.

The multilayer ceramic capacitor 1 is obtained in the aforementioned manner.

The aforementioned copper paste contains copper powder, which is pasted with addition of an organic vehicle and a solvent.

In the aforementioned multilayer ceramic capacitor 1, an increase in electrostatic capacitance and achievement of miniaturization are required. In a multilayer circuit board, further, high densification is also required. In order to satisfy such requirements, it is necessary to reduce the ceramic layers 2 in thickness and increase the internal electrodes 3 and 4 in number of stacking.

When the cofiring step is carried out in a nonoxidizing atmosphere as hereinabove described, however, the organic vehicle contained in the copper paste for forming the internal electrodes 3 and 4 is unsatisfactorily removed and there is an insufficient debindering effect. In the cofiring stage, therefore, voids 8 are defined between the ceramic layers 2 and the internal electrodes 3 or 4 or in the internal electrodes 3 or 4 as shown in FIG. 4, to remain in the as-obtained multilayer ceramic capacitor 1. This leads to characteristic deterioration of the multilayer ceramic capacitor 1.

Further, the material forming the ceramic layers 2 is substantially different in shrinkage factor from that forming the internal electrodes 3 and 4 and the external electrodes 6 and 7. Thus, the internal electrodes 3 and 4 and the external electrodes 6 and 7 tend to warp after the cofiring step. This results in such structural defects that the internal electrodes 3 and 4 are parted, the internal electrodes 3 and 4 are improperly connected with the external electrodes 6 and 7, and the laminate 5 itself is deformed.

In addition, electric resistance values provided by the internal electrodes 3 and 4 are increased by the aforementioned voids 8 and structural defects, to result in deterioration of electric characteristics of the multilayer ceramic capacitor 1.

SUMMARY OF THE INVENTION

Accordingly, an object of the present invention is to provide copper paste for an internal conductor of a multilayer ceramic electronic component, which can suppress occurrence of the aforementioned voids and structural defects.

Another object of the present invention is to provide a method of manufacturing a multilayer ceramic electronic component using the aforementioned copper paste.

The copper paste according to the present invention contains copper powder having a mean particle size of 0.3 to 2 µm in a particle size range of 0.1 to 4 µm and ceramic powder having a main component which is common to that of a ceramic material forming a plurality of ceramic layers included in a multilayer ceramic electronic component and being in a particle size range of 0.5 to 8 µm, as well as an organic vehicle and a solvent. The contents of the copper powder and the ceramic powder, and the total content of the organic vehicle and the solvent are in ranges of 40 to 70 percent by weight, 1 to 15 percent by weight, and 25 to 60 percent by weight respectively.

The ceramic powder preferably includes nonreducing ceramic powder. Such nonreducing ceramic powder is prepared from a ceramic material of $BaO\text{-}Al_2O_3\text{-}SiO_2\text{-}CaO\text{-}Cr_2O_3\text{-}B_2O_3$, for example.

The organic vehicle is prepared from ethyl cellulose resin, acrylic resin or alkyd resin, for example.

The solvent is prepared from a terpineol solvent, for example.

In order to manufacture a multilayer ceramic electronic component using such copper paste, a plurality of ceramic green sheets are prepared while the aforementioned copper paste is prepared. This copper paste contains the ceramic powder having a main component which is common to that of the ceramic material forming the ceramic green sheets. Then, the copper paste is applied onto at least one sheet selected from the ceramic green sheets, thereby forming a copper paste film. Then the ceramic green sheets are so stacked as to locate the copper paste film between the same, and the as-formed laminate of the ceramic green sheets is then fired.

In the aforementioned manufacturing method, the ceramic green sheets preferably contain a nonreducing ceramic material, and the firing step is carried out in a reducing or neutral atmosphere. In advance of the firing step, a copper paste for forming an external conductor may be applied to the outer surface of the laminate, so that not only the copper paste for forming an internal conductor but that for forming an external conductor are cofired with the ceramic material.

When the copper paste according to the present invention is employed for forming a copper paste film for defining an internal conductor, the effect of removing the organic vehicle from the copper paste, i.e., a debindering effect, is improved in the step of cofiring the copper paste film with the ceramic material, whereby it is possible to suppress formation of voids. Further, the internal conductor hardly warps after the firing step. Consequently, it is possible to suppress occurrence of the aforementioned structural defects. Thus, the electric resistance of the internal conductor is not increased by voids and structural defects, and it is possible to ensure sufficient reliability in electric characteristics of the as-obtained multilayer ceramic electronic component.

According to the present invention, it is possible to improve the occupied area and interconnection density of the internal conductor with respect to a single ceramic layer, while increasing the layer number of such internal conductors without increasing the thickness of the overall laminate. As the result, it is possible to increase electrostatic capacitance provided by the multilayer ceramic electronic component, while improving the degree of freedom in design within prescribed dimensions.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
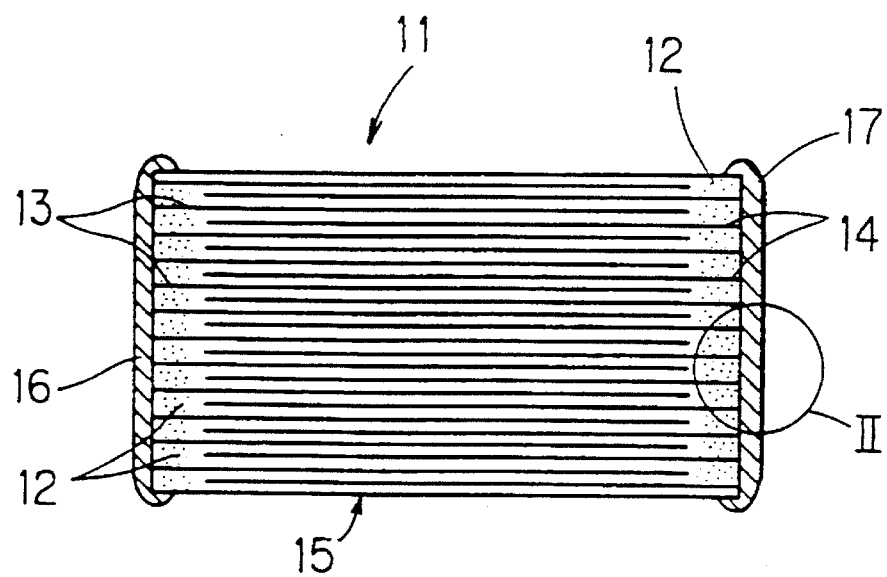
FIG. 1 is a sectional view showing a multilayer ceramic capacitor according to an embodiment of the present invention.
Figure 3:
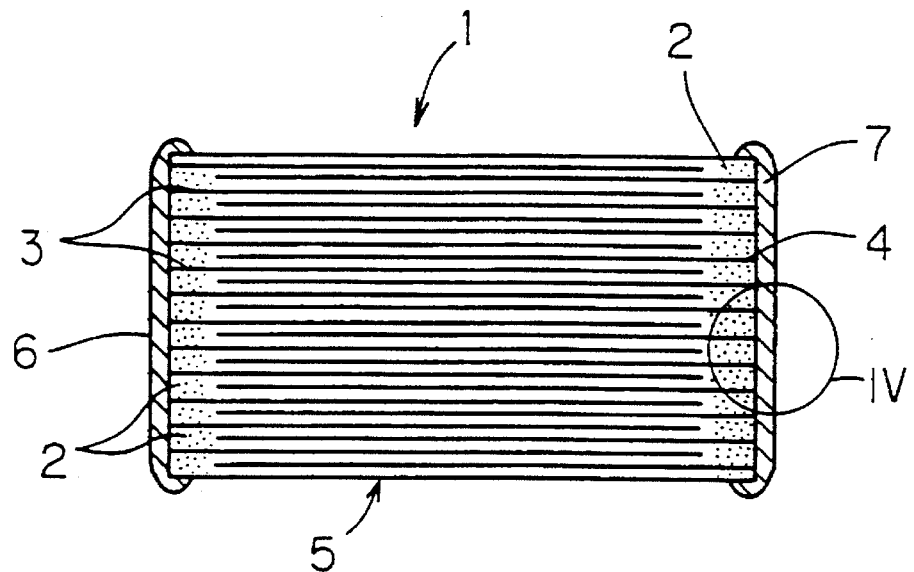
FIG. 3 is a sectional view showing a conventional multilayer ceramic capacitor.
Figure 4:
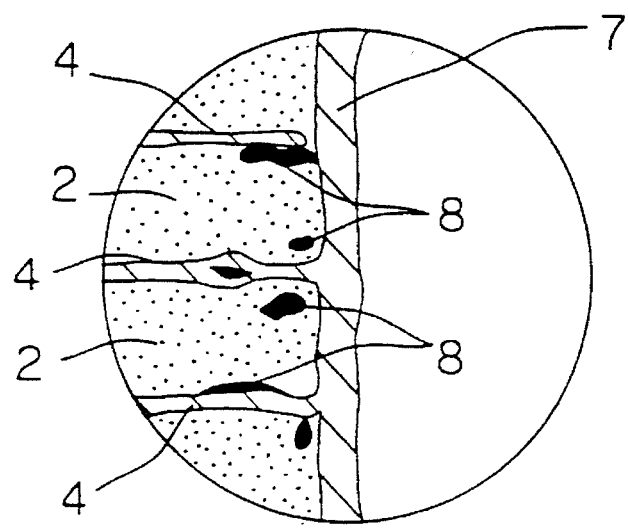
FIG. 4 is an enlarged sectional view showing a part IV appearing in FIG. 3.

Referring to FIG. 1, a multilayer ceramic capacitor 11 according to an embodiment of the present invention is substantially similar in structure to the conventional multilayer ceramic capacitor 1 shown in FIG. 3. This multilayer ceramic capacitor 11 comprises a laminate 15 having a structure obtained by alternately stacking a plurality of ceramic layers 12 and plural internal electrodes 13 and 14. This laminate 15 is provided with external electrodes 16 and 17 on its end surfaces respectively. The internal electrodes 13 reach the left end surface of the laminate 15 appearing in FIG. 1, to be electrically connected with the external electrode 16 on this end surface. On the other hand, the internal electrodes 14 reach the right end surface of the laminate 15 appearing in FIG. 1, to be electrically connected with the external electrode 17 on this end surface. These internal electrodes 13 and 14 are alternately arranged in the laminate 15.

In order to manufacture such a multilayer ceramic capacitor 11, prepared are a plurality of ceramic green sheets containing a nonreducing ceramic material, and copper paste containing copper powder having a mean particle size of 0.3 to 2 μm in a particle size range of 0.1 to 4 μm and ceramic powder having a main component which is common to that of a ceramic material forming the ceramic green sheets and being in a particle size range of 0.5 to 8 μm, as well as an organic vehicle and a solvent. In the copper paste, the contents of the copper powder and the ceramic powder, and the total content of the organic vehicle and the solvent are in ranges of 40 to 70 percent by weight, 1 to 15 percent by weight, and 25 to 60 percent by weight respectively. The aforementioned copper paste is employed to form copper paste films by screen printing for defining the internal electrodes 13 or 14 on specific ones selected from the plurality of ceramic green sheets for forming the ceramic layers 12.

Then, the ceramic green sheets are stacked to locate the copper paste films therebetween, pressed to each other and cut into proper dimensions, so that copper paste for forming the external electrodes 16 and 17 is applied onto the end surfaces of the as-obtained laminate chip. This copper paste may be identical to or different from that for forming the internal electrodes 13 and 14. Then the aforementioned laminate chip is fired in a reducing or neutral atmosphere. Thus, the multilayer ceramic capacitor 11 is obtained.

Experimental Example according to the present invention is now described.

First, a ceramic material of $BaO\text{-}Al_2O_3\text{-}SiO_2\text{-}CaO\text{-}Cr_2O_3B_2O_3$ was prepared, and its slurry was formed by a doctor blade coater, to provide ceramic green sheets.

On the other hand, ceramic powder materials each having a main component common to that of the ceramic material forming the aforementioned ceramic green sheets and being in a particle size range of 0.5 to 8 μm, organic vehicles of ethyl cellulose resin and terpineol solvents were added to copper powder materials having mean particle sizes shown in Table 1 and mixed with each other so that these materials attained the contents shown in Table 1 respectively. These copper powder materials were kneaded in a kneading machine having 3 rolling mills, to obtain copper paste materials for forming internal electrodes.

Then, the copper paste materials were applied onto ceramic green sheets by screen printing in thicknesses shown in Table 1, to form copper paste films for defining internal electrodes. Then, ceramic green sheets including those provided with such copper paste films were stacked, pressed to each other and cut to obtain laminate chips of prescribed dimensions. Thereafter the same copper paste materials as those for the internal electrodes were printed on end surfaces of the laminate chips for forming external electrodes. Thereafter the laminate chips were fired in a nitrogen atmosphere at a temperature of 970° C. for 1 hour.

States of void occurrence and chip deformation were observed in the respective samples obtained in the aforementioned manner. Table 1 shows the results.

TABLE 1

| Sample No. | Content of Copper Powder (wt %) | Mean Particle Size of Copper Powder (μm) | Content of Ceramic Powder (wt %) | Content of Organic Vehicle and Solvent (wt %) | Thickness of Copper Paste Film (μm) | Void Occurrence | Chip Deformation |
| --- | --- | --- | --- | --- | --- | --- | --- |
| 1 | 40 | 0.5 | 1 | 59 | 1.1 | no | no |
| 2 | 40 | 0.5 | 5 | 55 | 1.2 | no | no |
| 3 | 50 | 1 | 1 | 49 | 1.6 | no | no |
| 4 | 50 | 1 | 5 | 45 | 1.8 | no | no |
| 5 | 50 | 1 | 10 | 40 | 1.9 | no | no |
| 6 | 50 | 1 | 15 | 35 | 2.1 | no | no |
| 7 | 60 | 1 | 5 | 35 | 3.4 | no | no |
| 8 | 60 | 1 | 10 | 30 | 4.2 | no | no |
| 9 | 60 | 1 | 15 | 25 | 5.0 | no | no |
| 10* | 70 | 1 | 0 | 30 | 3.8 | yes | yes |
| 11 | 70 | 1 | 3 | 27 | 5.3 | no | no |
| 12 | 70 | 1 | 5 | 25 | 5.8 | no | no |
| 13* | 80 | 1 | 0 | 20 | 6.0 | yes | yes |
| 14* | 80 | 1 | 5 | 15 | 6.8 | yes | yes |
| 15* | 80 | 3 | 0 | 20 | 7.2 | yes | yes |
| 16* | 80 | 3 | 5 | 15 | 7.9 | yes | yes |

Referring to Table 1, the values of the asterisked samples were out of the scope of the present invention. All such asterisked samples exhibited occurrence of voids and deformation of the chips, and hence no sufficient reliability was attained in electrical conduction.

Figure 2:
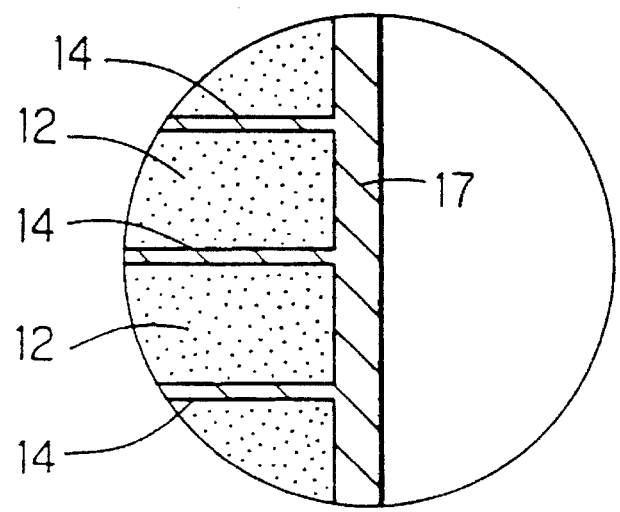
FIG. 2 is an enlarged sectional view showing a part II appearing in FIG. 1.

On the other hand, all samples whose values were in the scope of the present invention exhibited neither void occurrence nor chip deformation. Further, no structural defects were recognized in these samples, as shown in FIG. 2. Consequently, it was possible to ensure high reliability in electrical conduction according to these samples.

Also when another type of copper paste (not shown in Table 1) containing no ceramic powder was employed, it was possible to suppress void occurrence and chip deformation in the as-obtained sample by controlling the thickness of the copper paste film in a range of 1 to 3 μm, for example, while controlling the content of the copper powder in this copper paste in a range of 40 to 60 percent by weight, for example. However, it was confirmed that void occurrence or chip deformation was caused to reduce reliability in electric conduction when the content of the copper powder contained in the copper paste was increased to 70 percent by weight, for example, or the thickness of the copper paste film was increased in excess of 3 μm.

The present invention is not restricted to the aforementioned multilayer ceramic capacitor, but is applicable to all types of multilayer ceramic electronic components including a ceramic multilayer circuit board, for example.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a multilayer ceramic electronic component, comprising the steps of:

preparing a plurality of ceramic green sheets;

preparing copper paste containing copper powder having a mean particle size of 0.3 to 2 μm in a particle size range of 0.1 to 4 μm and ceramic powder having a main component being common to that of a ceramic material forming said ceramic green sheets and being in a particle size range of 0.5 to 8 μm, as well as an organic vehicle and a solvent, the contents of said copper powder and said ceramic powder, and the total content of said organic vehicle and said solvent being in ranges of 40 to 70 percent by weight, 1 to 15 percent by weight, and 25 to 60 percent by weight respectively;

applying said copper paste onto at least one sheet selected from said plurality of ceramic green sheets for forming a copper paste film;

stacking said ceramic green sheets to locate said copper paste film between said ceramic green sheets; and firing the as-formed laminate of said ceramic green sheets.

2. A method in accordance with claim 1, wherein said ceramic material contained in each of said ceramic green sheets and said copper paste includes a nonreducing ceramic material.

3. A method in accordance with claim 2, wherein said nonreducing ceramic powder includes ceramic powder of $BaO\text{-}Al_2O_3\text{-}SiO_2\text{-}CaO\text{-}Cr_2O_3\text{-}B_2O_3$.

4. A method in accordance with claim 1, wherein said organic vehicle contains at least one material selected from the group consisting of ethyl cellulose resin, acrylic resin and alkyd resin.

5. A method in accordance with claim 4 wherein the mean particle size of the copper powder is 0.5 to 1 μm.

6. A method in accordance with claim 5, wherein said organic vehicle contains at least one material selected from the group consisting ethyl cellulose resin, acrylic resin and alkyd resin.

7. A method of manufacturing a multilayer ceramic capacitor, comprising the steps of:

preparing a plurality of ceramic green sheets;

preparing copper paste containing copper powder having a mean particle size of 0.3 to 2 μm in a particle size range of 0.1 to 4 μm and ceramic powder having a main component being common to that of a ceramic material forming said ceramic green sheets and being in a particle size range of 0.5 to 8 μm, as well as an organic vehicle and a solvent, the contents of said copper powder and said ceramic powder, and the total content of said organic vehicle and said solvent being in ranges of 40 to 70 percent by weight, 1 to 15 percent by weight, and 25 to 60 percent by weight respectively;

applying said copper paste onto specific ones selected from said plurality of ceramic green sheets for forming internal copper paste films for defining internal electrodes;

stacking said ceramic green sheets to locate said copper paste films between said ceramic green sheets;

forming external copper paste films for defining external electrodes on both ends of the as-formed laminate of said ceramic green sheets to be electrically connected with associated ones of said internal copper paste films; and cofiring said ceramic green laminate with said internal and external copper paste films.

8. A method in accordance with claim 7, wherein said external copper paste films are formed of said copper paste.

9. A method in accordance with claim 8, wherein said ceramic material contained in each of said ceramic green sheets and said copper paste includes a nonreducing ceramic material.

10. A method in accordance with claim 9, wherein the mean particle size of the copper powder is 0.5 to 1 μm.

11. A method in accordance with claim 10, wherein said organic vehicle contains at least one material selected from the group consisting of ethyl cellulose resin, acrylic resin and alkyd resin.

12. A method in accordance with claim 11, wherein said solvent includes a terpineol solvent.

13. A method in accordance with claim 12, wherein said organic vehicle contains ethyl cellulose.

14. A method in accordance with claim 13, wherein said nonreducing ceramic powder includes ceramic powder of $BaOAl_2O_3SiO_2\text{-}CaO\text{-}Cr_2O_3\text{-}B_2O_3$.

15. A method in accordance with claim 7, wherein said organic vehicle contains at least one material selected from the group consisting of ethyl cellulose resin, acrylic resin and alkyd resin.

16. A method in accordance with claim 7, wherein said solvent includes a terpineol solvent.

* * * * *